(12) United States Patent  
Calderin et al.

(10) Patent No.: US 11,888,504 B2  
(45) Date of Patent: Jan. 30, 2024

(54) ELECTRONIC DEVICES WITH OUTPUT LOAD INDEPENDENT DETECTION CAPABILITIES

(71) Applicant: Apple Inc., Cupertino, CA (US)

(72) Inventors: Lucas Calderin, Berkeley, CA (US); Mehmet T Ozgun, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/675,983

(22) Filed: Feb. 18, 2022

(65) Prior Publication Data

US 2023/0268941 A1     Aug. 24, 2023

(51) Int. Cl.
    *H04B 1/04*        (2006.01)
    *H03F 3/24*        (2006.01)

(52) U.S. Cl.
    CPC ........... *H04B 1/0475* (2013.01); *H03F 3/245* (2013.01); *H03F 2200/451* (2013.01); *H04B 2001/0416* (2013.01)

(58) Field of Classification Search
    CPC .......... H04B 1/0475; H04B 2001/0416; H03F 3/245; H03F 2200/451
    USPC ....................................................... 375/297
    See application file for complete search history.

(56) References Cited

U.S. PATENT DOCUMENTS

| | | | |
|---|---|---|---|
| 7,161,358 B1 | 1/2007 | Tanbakuchi et al. | |
| 9,014,647 B2 | 4/2015 | Kitching et al. | |
| 9,755,670 B2 | 9/2017 | Chen et al. | |
| 9,947,985 B2 | 4/2018 | Solomko et al. | |
| 10,181,823 B1 | 1/2019 | Chen et al. | |
| 10,879,579 B2 | 12/2020 | Zhang et al. | |
| 2012/0161898 A1* | 6/2012 | Gorbachov | H01P 5/185 333/112 |
| 2017/0026020 A1* | 1/2017 | Solomko | H01P 5/184 |

(Continued)

FOREIGN PATENT DOCUMENTS

WO     2009144648 A2     12/2009

OTHER PUBLICATIONS

Alexander Alt et al., Concept for the Implementation of Very High Directivity and Decade Bandwidth in Compact Microstrip Directional Couplers, Proceedings of the 46th European Microwave Conference, Oct. 4-6, 2016, pp. 210-213. IEEE Xplore, London, UK.

*Primary Examiner* — Kevin M Burd
(74) *Attorney, Agent, or Firm* — Treyz Law Group, P.C.; Michael H. Lyons

(57) ABSTRACT

An electronic device may include signal transmission circuitry such as wireless circuitry having a signal source, a signal path, and an output node coupled to an output load. The signal source may transmit a signal to the output load over the signal path. The output load may have an impedance characterized by a first reflection coefficient. A signal coupler may be disposed on the signal path. A power detector coupled to a coupled node of the signal coupler may measure a voltage at the third node. A termination coupled to an isolated node of the signal coupler may include components that cause the termination to exhibit a second reflection coefficient. The second reflection coefficient may be selected to configure the voltage at the third node to track a power wave at the output load to within a constant that is invariant as the first reflection coefficient changes over time.

16 Claims, 6 Drawing Sheets

(56) References Cited

U.S. PATENT DOCUMENTS

2017/0358857 A1   12/2017  Watkins
2021/0218430 A1    7/2021  Han et al.

* cited by examiner

ELECTRONIC DEVICES WITH OUTPUT LOAD INDEPENDENT DETECTION CAPABILITIES

FIELD

This disclosure relates generally to electronic devices and, more particularly, to electronic devices with circuitry for transmitting signals.

BACKGROUND

Electronic devices are often provided with signal transmission capabilities in which a signal is transmitted onto an output load. Electronic devices with signal transmission capabilities include wireless electronic devices having a wireless transmitter that transmits radio-frequency signals onto an output load such as an antenna.

It is often desirable to be able to measure one or more characteristics of the output load by measuring the output power of the transmitted signal at the output load. However, the presence of other circuitry at or around the output load can make it difficult to accurately measure output power at the output load, particularly as the impedance of the output load changes over time.

SUMMARY

An electronic device may include signal transmission circuitry having a signal source, a signal path, and an output node coupled to an output load. For example, the signal transmission circuitry may be part of wireless circuitry in the electronic device. The signal source may transmit a signal to the output load over the signal path. The output load may have an impedance characterized by a first reflection coefficient.

A signal coupler may be disposed on the signal path. The signal coupler may have a first node coupled to the signal source, a second node coupled to the output path leading to an output load, a coupled node, and an isolated node. A power detector may be coupled to the coupled node. The power detector may measure a voltage at the third node. A termination may be coupled to the isolated node. The termination may include circuit components that configure the termination to exhibit an impedance characterized by a second reflection coefficient. The impedance and the second reflection coefficient of the termination may be selected to configure the voltage at the third node to track a power wave into the output load to within a constant that is invariant as the first reflection coefficient changes over time (e.g., due to loading from external objects). Control circuitry may process the voltage measured by the power detector to accurately perform other operations such as antenna tuning or switching, backing off transmit power level, etc.

An aspect of the invention provides an electronic device. The electronic device can include a signal source. The electronic device can include an output load coupled to the signal source over a signal path, the signal source being configured to transmit a signal to the output load over the signal path and the output load having a first reflection coefficient. The electronic device can include a signal coupler disposed on the signal path, the signal coupler having a first node communicably coupled to the signal source, a second node communicably coupled to the output load, a third node, and a fourth node. The electronic device can include a power detector communicably coupled to the third node and configured to measure a voltage at the third node. The electronic device can include a termination communicably coupled to the fourth node, the termination having a second reflection coefficient that causes the voltage at the third node to track a power wave at the output load to within a constant that is invariant as the first reflection coefficient changes over time.

An aspect of the disclosure provides a method of operating an electronic device. The method can include with a power amplifier, transmitting a radio-frequency signal to an output node over a transmission line, the output node being coupled to an antenna. The method can include with a signal coupler disposed on the transmission line, coupling at least some of the radio-frequency signal onto a coupled node of the signal coupler while an isolated node of the signal coupler is coupled to a termination that causes a power wave of the radio-frequency signal coupled onto the coupled node to track a voltage of the radio-frequency signal at the output node to within a constant that is invariant as a voltage standing wave ratio (VSWR) of the antenna changes over time. The method can include with a power detector, detecting the voltage of the radio-frequency signal coupled onto the coupled node.

An aspect of the disclosure provides an electronic device. The electronic device can include a power amplifier. The electronic device can include an output node coupled to an antenna. The electronic device can include a transmission line that couples the power amplifier to the output node. The electronic device can include a signal coupler disposed on the transmission line and having a coupled node and an isolated node, the signal coupler being configured to transmit a first portion of a signal wave to the output node while coupling a second portion of the signal wave onto the coupled node. The electronic device can include a power detector communicably coupled to the coupled node. The electronic device can include a termination communicably coupled to the isolated node, wherein the termination has an impedance that causes a ratio of a magnitude of the second portion of the signal wave coupled onto the coupled node to a magnitude of the first portion of the signal wave transmitted to the output node to be a constant value as an impedance of the output node varies over time.

DETAILED DESCRIPTION

Figure 1:
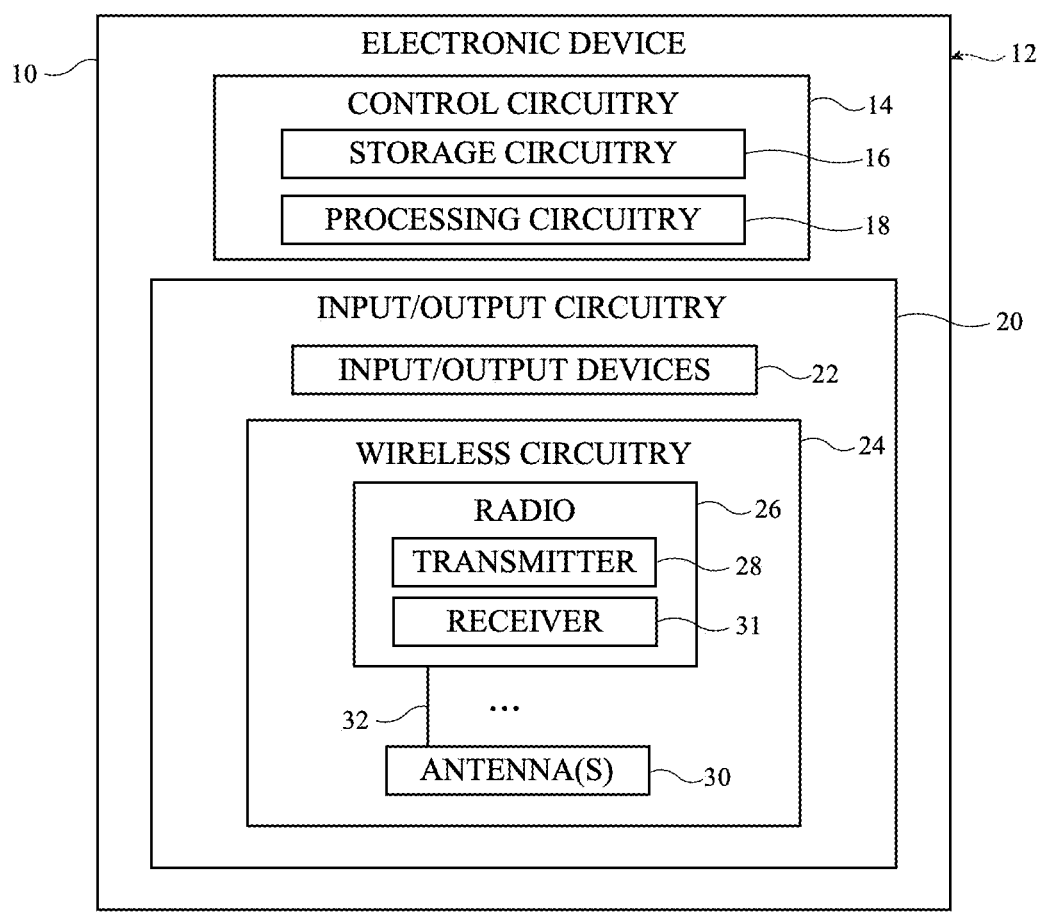
FIG. 1 is a functional block diagram of an illustrative electronic device in accordance with some embodiments.

An electronic device such as device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, a networking device, equipment that implements the functionality of two or more of these devices, or other electronic equipment. User equipment device 10 may sometimes be referred to herein as electronic device 10 or simply as device 10.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors, microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11 ad protocols (e.g., ultrawideband protocols), cellular telephone protocols (e.g., 3G protocols, 4 G (LTE) protocols, 3 GPP Fifth Generation (5 G) New Radio (NR) protocols, etc.), antenna diversity protocols, satellite navigation system protocols (e.g., global positioning system (GPS) protocols, global navigation satellite system (GLONASS) protocols, etc.), antenna-based spatial ranging protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), temperature sensors, etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include two or more antennas 30. Antennas 30 may be formed using any desired antenna structures for conveying radio-frequency signals. For example, antennas 30 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of antennas 30 over time. If desired, two or more of antennas 30 may be integrated into a phased antenna array (sometimes referred to herein as a phased array antenna) in which each of the antennas conveys radio-frequency signals with a respective phase and magnitude that is adjusted over time so the radio-frequency signals constructively and destructively interfere to produce a signal beam in a given pointing direction.

The term "convey radio-frequency signals" as used herein means the transmission and/or reception of the radio-frequency signals (e.g., for performing unidirectional and/or bidirectional wireless communications with external wireless communications equipment). Antennas 30 may transmit the radio-frequency signals by radiating the radio-frequency signals into free space (or to free space through intervening device structures such as a dielectric cover layer). Antennas 30 may additionally or alternatively receive the radio-frequency signals from free space (e.g., through intervening devices structures such as a dielectric cover layer). The transmission and reception of radio-frequency signals by antennas 30 each involve the excitation or resonance of antenna currents on an antenna resonating element in the antenna by the radio-frequency signals within the frequency band(s) of operation of the antenna.

Wireless circuitry 24 may include one or more radios 26. Radio 26 may include circuitry that operates on signals at baseband frequencies (e.g., baseband circuitry) and radio-frequency transceiver circuitry such as one or more radio-frequency transmitters 28 and one or more radio-frequency receivers 31. Transmitter 28 may include signal generator circuitry, modulation circuitry, mixer circuitry for upconverting signals from baseband frequencies to intermediate frequencies and/or radio frequencies, amplifier circuitry such as one or more power amplifiers, digital-to-analog converter (DAC) circuitry, control paths, power supply paths, switching circuitry, filter circuitry, and/or any other circuitry for transmitting radio-frequency signals using antennas 30. Receiver 31 may include demodulation circuitry, mixer circuitry for downconverting signals from intermediate frequencies and/or radio frequencies to baseband frequencies, amplifier circuitry (e.g., one or more low-noise amplifiers (LNAs)), analog-to-digital converter (ADC) circuitry, control paths, power supply paths, signal paths, switching circuitry, filter circuitry, and/or any other circuitry for receiving radio-frequency signals using antennas 30. The components of radio 26 may be mounted onto a single substrate or integrated into a single integrated circuit, chip, package, or system-on-chip (SOC) or may be distributed between multiple substrates, integrated circuits, chips, packages, or SOCs.

Each radio 26 may be coupled to one or more antennas 30 over one or more radio-frequency transmission lines 32. Radio-frequency transmission lines 32 may include coaxial cables, microstrip transmission lines, stripline transmission lines, edge-coupled microstrip transmission lines, edge-coupled stripline transmission lines, transmission lines formed from combinations of transmission lines of these types, etc. Radio-frequency transmission lines 32 may be integrated into rigid and/or flexible printed circuit boards if desired. One or more radio-frequency transmission lines 32 may be shared between multiple radios 26 if desired. Radio-frequency front end (RFFE) modules may be interposed on one or more radio-frequency transmission lines 32. The radio-frequency front end modules may include substrates, integrated circuits, chips, or packages that are separate from radios 26 and may include filter circuitry, switching circuitry, amplifier circuitry, impedance matching circuitry, radio-frequency coupler circuitry, and/or any other desired radio-frequency circuitry for operating on the radio-frequency signals conveyed over radio-frequency transmission lines 32.

Radio 26 may transmit and/or receive radio-frequency signals within corresponding frequency bands at radio frequencies (sometimes referred to herein as communications bands or simply as "bands"). The frequency bands handled by radio 26 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3 G bands, 4 G LTE bands, 5 G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3 GPP wireless communications standards, communications bands under the IEEE 802.XX family of standards, and/or any other desired frequency bands of interest.

The example of FIG. 1 is merely illustrative. While control circuitry 14 is shown separately from wireless circuitry 24 in the example of FIG. 1 for the sake of clarity, wireless circuitry 24 may include processing circuitry (e.g., one or more processors) that forms a part of processing circuitry 18 and/or storage circuitry that forms a part of storage circuitry 16 of control circuitry 14 (e.g., portions of control circuitry 14 may be implemented on wireless circuitry 24). As an example, control circuitry 14 may include baseband circuitry (e.g., one or more baseband processors), digital control circuitry, analog control circuitry, and/or other control circuitry that forms part of radio 26. The baseband circuitry may, for example, access a communication protocol stack on control circuitry 14 (e.g., storage circuitry 16) to: perform user plane functions at a PHY layer, MAC layer, RLC layer, PDCP layer, SDAP layer, and/or PDU layer, and/or to perform control plane functions at the PHY layer, MAC layer, RLC layer, PDCP layer, RRC, layer, and/or non-access stratum layer. If desired, the PHY layer operations may additionally or alternatively be performed by radio-frequency (RF) interface circuitry in wireless circuitry 24.

Electronic devices such as device 10 may include circuitry that transmits signals. This circuitry includes a signal source, which can be modeled as an arbitrary source impedance having a source power, that is coupled to an output node over a signal path. The output node may be coupled to an output load having an output impedance. In signal transmission systems such as these, it may be desirable to be able to perform measurements of the transmit signals at the output node. For example, measurements of the output power level of the transmitted signals at the output node can be used to characterize the performance of the output load, which can then be used to calibrate subsequent signal transmissions, to adjust circuitry in device 10, or to perform other actions.

Figure 2:
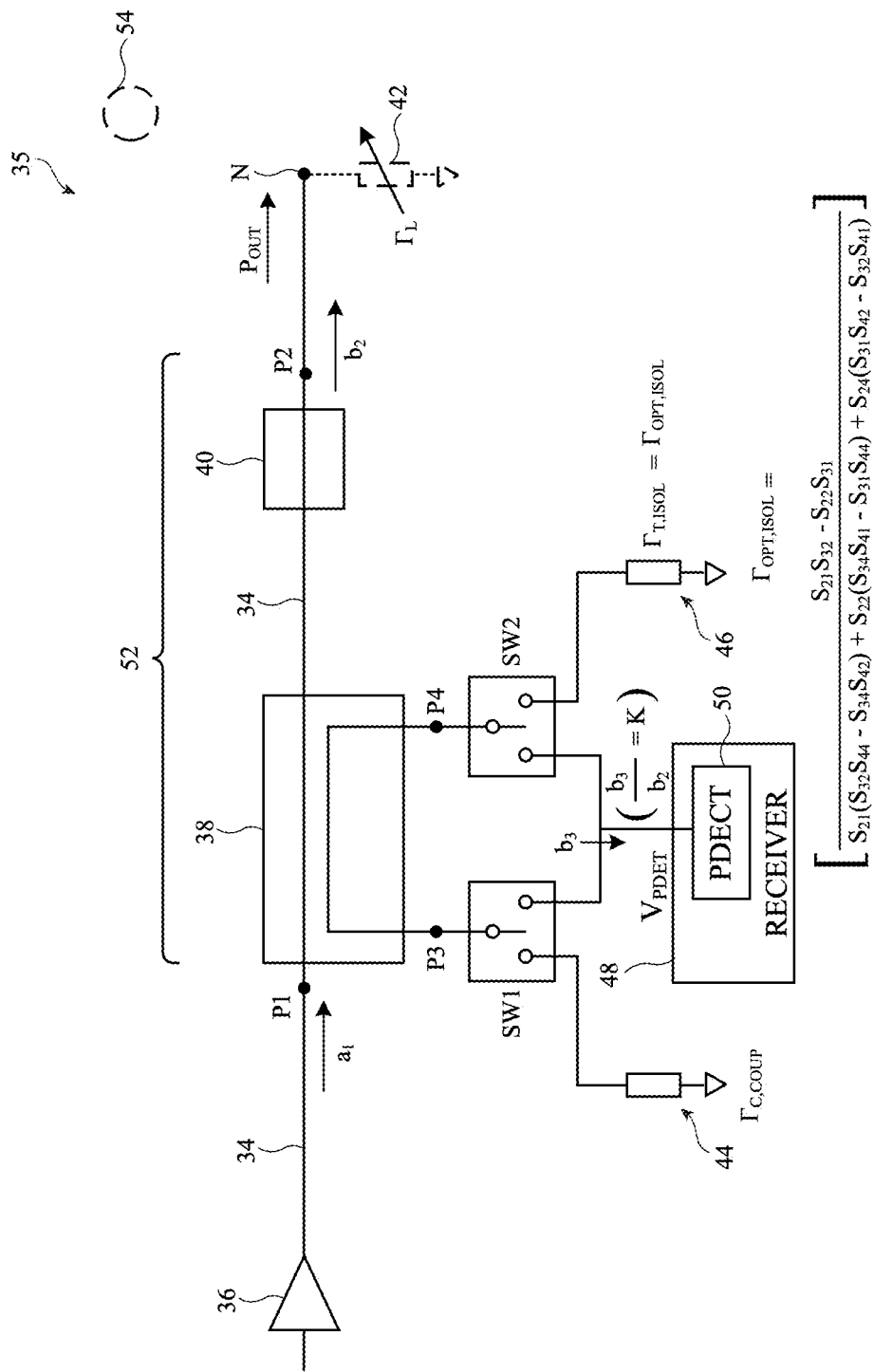
FIG. 2 is a diagram of illustrative signal transmission circuitry having a signal coupler and having an isolated node termination that configures a receiver to measure transmit signal power wave levels at an output load that are invariant to impedance changes at the output load in accordance with some embodiments.

FIG. 2 is a diagram of illustrative signal transmission circuitry 35 in device 10. As shown in FIG. 2, signal transmission circuitry 35 may include a signal source 36 having a source impedance and a source power. Signal source 36 may be coupled to output node N over signal path 34. Output node N may be coupled to an output load 42 over signal path 34. Signal source 36 may transmit signals to output node N over signal path 34. It may be desirable to be able to measure the output power level Pour of the transmitted signals at output node N (e.g., at output load 42). Measuring output power level Pour may, for example, allow control circuitry 14 in device 10 (FIG. 1) to characterize the performance of output load 42, which can then be used to calibrate subsequent signal transmissions, to adjust circuitry in device 10, or to perform other actions, as examples.

Signal transmission circuitry 35 may, for example, form a part of wireless circuitry 24 (FIG. 1). In this example, signal source 36 may be a power amplifier (e.g., in transmitter 28 of FIG. 1), signal path 34 may be a radio-frequency transmission line (e.g., radio-frequency transmission line 32 of FIG. 1), and output load 42 may be a corresponding antenna (e.g., antenna 30 of FIG. 1). Signal source 36 may therefore sometimes be referred to herein as power amplifier (PA) 36 and signal path 34 may sometimes be referred to herein as transmission line 34. Power amplifier 36 may transmit radio-frequency signals over transmission line 34 and antenna 30. While implementations in which signal transmission circuitry 35 forms a part of wireless circuitry 24 for transmitting radio-frequency signals over antenna 30 are described herein as an example, signal transmission circuitry 35 may, in general, include any desired signal transmission circuitry in device 10 (e.g., for transmitting signals at any frequencies between different boards, packages, nodes, chips, integrated circuits, processors, components, accessories, devices such as device 10, etc.). The systems and methods for measuring output power levels and otherwise characterizing the performance of output node N when signal transmission circuitry 35 forms a part of wireless circuitry 24 for transmitting radio-frequency signals over antenna 30 as described herein may be similarly applied in any of these signal transmission contexts.

Output load 42 may have an impedance. The impedance of output load 42 may vary (e.g., at a given frequency) due to changes in environmental conditions around output load 42, such as when an external object 54 approaches the output load. In examples where output load 42 is an antenna, external object 54 (e.g., a user's hand or other body part) may externally load the antenna, causing the antenna to become detuned and producing an impedance discontinuity between output node N and transmission line 34. This impedance discontinuity may cause a relatively large amount of the transmitted signal power to be reflected back towards power amplifier 36 from output node N, reducing the overall efficiency of the antenna. By measuring output power level $P_{OUT}$, signal transmission circuitry 35 may measure (e.g., detect) the impedance of output load 42 (e.g., as subject to external loading by external object 54) and may use this information to adjust impedance matching circuitry for the antenna, to adjust tuning of the antenna, to reduce transmit power level of power amplifier 36 (e.g., to comply with regulatory limits on radio-frequency energy exposure or absorption), and/or to perform any other desired operations to characterize the performance of output load 42 or to mitigate loading by external object 54. In general, the impedance of output load 42 is a complex value and may be characterized by the complex reflection coefficient $\Gamma_L$. Reflection coefficient $\Gamma_L$ may have a relatively high magnitude when a relatively large impedance discontinuity at output node N causes a relatively large amount of the transmitted signal power to be reflected back towards power amplifier 36, for example.

Ideally, signal transmission circuitry 35 can measure output power level Pour by placing a power detector at the location of output node N. However, in practice, there may be one or more circuit blocks 40 interposed along transmission line 34 between power amplifier 36 and output node N (e.g., circuit blocks for performing one or more functions of device 10 that may or may not be associated with the transmission of signals at output node N). Circuit blocks 40 may include, for example, passive devices, capacitors, inductors, resistors, impedance matching circuitry, antenna tuning circuitry, routing circuitry, transmission lines, switches, filters, other couplers coupled to radio-frequency front end circuitry, transmit/receive (TR) switches connected to other radio-frequency front end circuitry, etc. The presence of circuit blocks 40 may make it infeasible or impractical to place a power detector at output node N.

Signal transmission circuitry 35 may therefore include a signal coupler such as signal coupler 38 interposed on transmission line 34 for detecting output power level $P_{OUT}$. Signal coupler 38 may be a directional coupler or any other desired coupler that couples signals off of transmission line 34 and towards receiver 48 (e.g., a dedicated feedback receiver, a part of receiver 31 of FIG. 1, etc.). If desired, signal coupler 38 may include transmission line structures, transformers, or other signal coupling structures. Receiver 48 may include a power detector such as power detector (PDECT) 50 and/or any other desired circuitry for receiving and/or measuring signals coupled off of transmission line 34 by signal coupler 38. Power detector 50 need not be integrated within a receiver such as receiver 48, if desired. The signal coupled off of transmission line 34 may exhibit a voltage $V_{PDET}$ at power detector 50. Power detector 50 may measure voltage $V_{PDET}$ and/or the power associated with voltage $V_{PDET}$ (e.g., power detector 50 may convert a radio-frequency voltage waveform into a DC voltage). Control circuitry 14 (FIG. 1) may process the voltage and/or power measured by power detector 50 to measure (e.g., estimate, determine, identify, compute, calculate, generate, sense, etc.) the signal or power wave at output node N, which may be characteristic of output power level Pour (e.g., without placing a power detector at output node N, thereby accommodating the presence of circuit blocks 40 along transmission line 34).

Signal coupler 38 may have a first port P1 communicably coupled to the output of power amplifier 36 over a first portion of transmission line 34, a second port P2 communicably coupled to output node N over a second portion of transmission line 34 (e.g., where port P2 is between circuit blocks 40 and output node N or, alternatively, where the signal coupler has an internal port P2_internal at the input of circuit blocks 40), a third port P3 communicably coupled to receiver 48, and a fourth port P4 communicably coupled to a termination impedance such as isolated node termination 46. If desired, additional circuit blocks or components (not shown in FIG. 2 for the sake of clarity) may be disposed along transmission line 34 between port P1 and the output of power amplifier 36. Port P3 represents the coupled node of signal coupler 38 and may therefore sometimes be referred to herein as coupled node P3. Port P4 represents the isolated node of signal coupler 38 (e.g., the port/node isolated from the signal source) and may therefore sometimes be referred to herein as isolated node P4. Isolated node termination 46 may have a complex impedance characterized by a corresponding complex reflection coefficient $\Gamma_{T,ISOL}$. Isolated node termination 46 may include one or more resistive, capacitive, inductive, and/or switching components that configure isolated node termination 46 to exhibit the impedance characterized by reflection coefficient $\Gamma_{T,ISOL}$.

In the example of FIG. 2, signal coupler 38 is a switch coupler having switching circuitry such as switch SW1 and switch SW2. As shown in FIG. 2, switch SW1 may have a first terminal coupled to coupled node P3, a second terminal coupled to a termination impedance such as coupled node termination 44, and a third port coupled to power detector 50 in receiver 48. Coupled node termination 44 may have a complex impedance characterized by a corresponding complex reflection coefficient $\Gamma_{T,COUP}$. Coupled node termination 44 may include one or more resistive, capacitive, inductive, and/or switching components that configure coupled node termination 44 to exhibit the impedance characterized by reflection coefficient $\Gamma_{T,COUP}$. Switch SW2 may have a first terminal coupled to isolated node P4, a second terminal coupled to isolated node termination 46, and a third terminal coupled to power detector 50.

When configured in this way, portions of transmission line 34, signal coupler 38, switches SW1 and SW2, terminations 44 and 46, circuit blocks 40, and receiver 48 may collectively form a reflectometer 52 for transmission line 34. During signal transmission, power amplifier 36 may transmit radio-frequency signals on transmission line 34. These signals may sometimes be referred to as forward wave (FW) signals. The energy of the FW signals into port P1 may be characterized by coefficient a1 (e.g., in a four-port network model of the system). The energy (power wave) of the FW signals out of port P2 and into the output load may be characterized by a coefficient $b_2$ (e.g., the magnitude of the signal wave of the FW signals in the four-port network model).

Switches SW1 and SW2 may have a first state in which switch SW1 couples coupled node P3 to power detector 50 and switch SW2 couples isolated node P4 to isolated node termination 46. In the first state, reflectometer 52 may perform FW measurements. Signal coupler 38 may couple some of the FW signals off of transmission line 34 and may pass the FW signals (as well as a portion of the RW signal bouncing off the isolated node termination) to power detector 50 via coupled node P3 and switch SW1. Power detector 50 may measure the amplitude and/or phase of the FW signals.

During signal transmission, some of the FW signals will reflect off of output node N and back towards signal coupler 38 (e.g., due to the impedance discontinuity between transmission line 34 and output node N, which may change based on the presence of external object 54). These reflected signals may sometimes be referred to as reverse wave (RW) signals. Switches SW1 and SW2 may also have a second state in which switch SW1 couples coupled node P3 to coupled node termination 44 and switch SW2 couples isolated node P4 to power detector 50. In the second state, reflectometer 52 may perform RW signal measurements. Signal coupler 38 may couple some of the RW signals off of transmission line 34 and may pass the RW signals to power detector 50 via isolated node P4 and switch SW2. Power detector 50 may measure the amplitude and/or phase of the RW signals. Control circuitry 14 may process the FW signal measurements and/or the RW signal measurements to characterize (e.g., identify, determine, detect, compute, calculate, measure, etc.) the impedance of the antenna (e.g., reflection coefficient $\Gamma_L$) for performing subsequent processing operations, for example.

Figure 3:
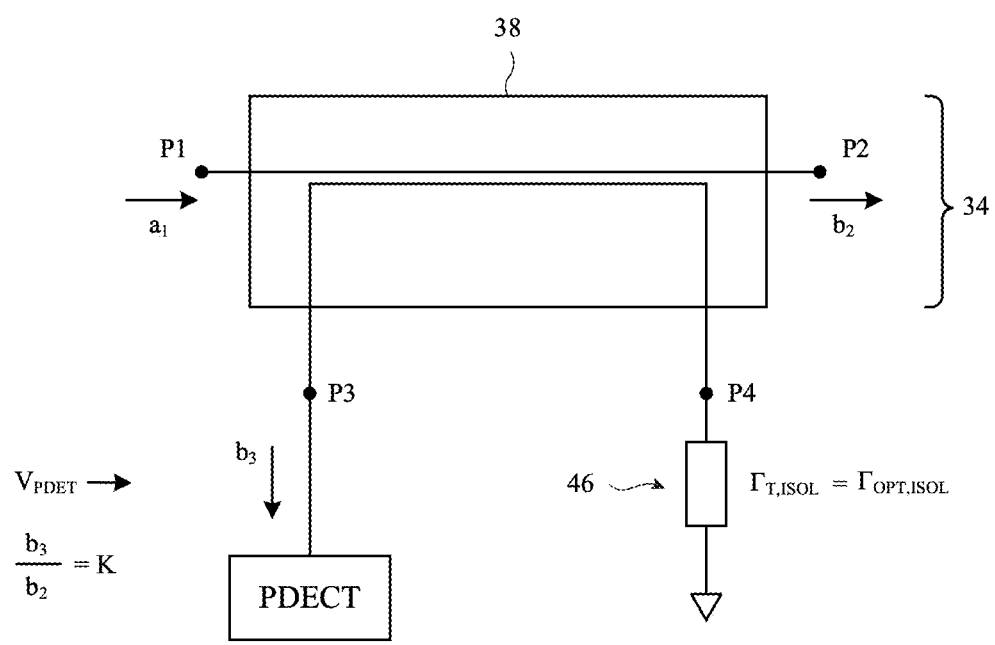
FIG. 3 is a diagram showing how an illustrative signal coupler of the type shown in FIG. 2 may be simplified and implemented without switches in accordance with some embodiments.

The example of FIG. 2 in which signal coupler 38 is integrated into reflectometer 52 is merely illustrative. In general, signal coupler 38 need not be a switch coupler integrated into a reflectometer. In other words, switches SW1 and SW2 and coupled node termination 44 may be omitted if desired. FIG. 3 is a diagram showing a simplest case of how signal coupler 38 may be interposed onto transmission line 34.

As shown in FIG. 3, coupled node P3 may be coupled to power detector 50 and isolated node P4 may be coupled to isolated node termination 46 (e.g., without intervening switches). The simplified case of FIG. 3 also models the reflectometer arrangement shown in FIG. 2 when performing FW signal measurements, for example. Implementing signal coupler 38 within reflectometer 52 of FIG. 2 may allow for additional measurements such as RW signal measurements relative to the simplified case of FIG. 3, which may allow signal coupler 38 to be used as part of a vector network analyzer (VNA), for example. The energy of the signals passed to power detector 50 from coupled node P3 may be characterized by coefficient $b_3$ (e.g., in the four-port network model). Coefficient $b_3$ may characterize the energy (power wave) passing to power detector 50 as shown in FIG. 3 or may characterize the energy of the FW signals and the RW signals passing to power detector 50 as shown in FIG. 2.

Returning to FIG. 2, using signal coupler 38 to measure the power wave at output node N may accommodate the presence of other circuit blocks 40 at or near output node N. However, if care is not taken, measurements made using signal coupler 38 may undesirably vary as the reflection coefficient $\Gamma_L$ of output load 42 varies (e.g., due to changes in the presence of external object 54). In other words, the ratio $b_3/b_2$ may vary over different reflection coefficients $\Gamma_L$ due to changes in external object 54, which is generally outside of the control of the circuitry on device 10. These variations can reduce the accuracy of the power measurements made by power detector 50, thereby reducing accuracy in how device 10 characterizes the impedance of output load 42. In examples where output load 42 is an antenna, this may reduce the accuracy of the antenna impedance as measured by the device, thereby causing the antenna to not be properly matched or tuned in different operating conditions, leading to reduced antenna efficiency.

To mitigate these issues, isolated node termination 46 of FIGS. 2 and 3 may be configured to exhibit a particular complex impedance that is characterized by reflection coefficient $\Gamma_{OPT,ISOL}$. In other words, isolated node termination 46 may include capacitive, resistive, switching, inductive, and/or other circuit components arranged in a manner (e.g., in series, in parallel, with respect to ground, etc.) that configure isolated node termination 46 to exhibit a reflection coefficient $\Gamma_{T,ISOL} = \Gamma_{OPT,ISOL}$.

The reflected and incident power waves at the ports of reflectometer 52 may be characterized by sixteen scattering parameters or S-parameters for a fixed frequency, which are complex numbers associated with the four-port network model of signal coupler 38 (e.g., where the first (input) port is defined by port $P_1$, the second (output) port is defined by port P2, the third port is defined by coupled node $P_3$, and the fourth port is defined by isolated node P4). The S-parameters include: $S_{11}$ (e.g., a reflection coefficient at the input port), $S_{12}$ (e.g., characterizing reverse voltage gain), $S_{13}$, $S_{14}$, $S_{21}$ (e.g., characterizing forward voltage gain), $S_{22}$ (e.g., a reflection coefficient at the output port), $S_{23}$, $S_{24}$, $S_{31}$, $S_{32}$, $S_{33}$, $S_{34}$, $S_{41}$, $S_{42}$, $S_{43}$, and $S_{44}$. The circuit components of isolated node termination 46 may be selected such that isolated node termination 46 exhibits an impedance characterized by a reflection coefficient $\Gamma_{T,ISOL}=\Gamma_{OPT,ISOL}$, where $\Gamma_{OPT,ISOL}$ is given by equation 1.

$$\Gamma_{OPT,ISOL} = \frac{s_{21}s_{32} - s_{22}s_{31}}{s_{21}(s_{32}s_{44} - s_{34}s_{42}) + s_{22}(s_{34}s_{41} - s_{31}s_{44}) + s_{24}(s_{31}s_{42} - s_{32}s_{41})} \quad (1)$$

In other words, reflection coefficient $\Gamma_{OPT,ISOL}$ is a function of each of the S-parameters except for $S_{11}$, $S_{12}$, $S_{13}$, $S_{14}$, $S_{23}$, $S_{33}$, and $S_{43}$. The numerator of reflection coefficient $\Gamma_{OPT,ISOL}$ is a function of $S_{21}$, $S_{32}$, $S_{22}$, and $S_{31}$. The denominator of reflection coefficient $\Gamma_{OPT,ISOL}$ is a function of $S_{21}$, $S_{32}$, $S_{44}$, $S_{34}$, $S_{42}$, $S_{22}$, $S_{41}$, $S_{31}$, $S_{24}$, and $S_{42}$. When configured to exhibit this impedance, isolated node termination 46 configures the ratio of coefficients $b_3/b_2$ to be invariant or constant as the impedance of output load 42 (reflection coefficient $\Gamma_L$) changes over time. This in turn configures the voltage $V_{PDET}$ at coupled node P3 and into power detector 50 and its corresponding power (e.g., power level $P_{PDET}$ of FIG. 3) to track the amplitude (magnitude) of the FW signal (power wave) at output node N (e.g., the power wave having output power level Pout) to within a constant value that does not change as the impedance of output load 42 (reflection coefficient $\Gamma_L$) changes over time (e.g., as external object 54 moves closer to or farther from output load 42). Put differently, isolated node terminating impedance has an impedance that allows $b_3/b_2$ to be constant (e.g., equal to a constant k) independent of reflection coefficient $\Gamma_L$, phase and/or magnitude of the signal at output node N, and/or the voltage standing wave ratio (VSWR) at output node N. The power levels measured by power detector 50 will therefore properly and accurately track the power wave at output node N even as the impedance (e.g., reflection coefficient $\Gamma_L$, phase and/or magnitude, and/or VSWR) of output load 42 changes due to changes in the presence of external object 54 or other factors. Control circuitry 14 (FIG. 1) may then use the accurate power level measurements to perform other processing operations with a high degree of accuracy and confidence across a wide variety of external loading conditions.

Figure 4:
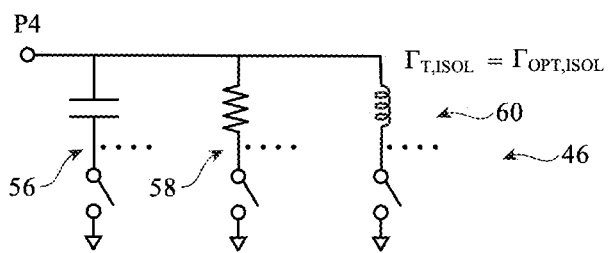
FIG. 4 is a circuit diagram of an illustrative isolated node termination in accordance with some embodiments.

FIG. 4 is a circuit diagram of isolated node termination 46. As shown in FIG. 4, isolated node termination 46 may include one or more circuit components coupled between isolated node P4 and ground. For example, isolated node termination 46 may include one or more capacitors 56 (e.g., switchable capacitors), one or more resistors 58 (e.g., switchable resistors), and/or one or more inductors 60 (e.g., switchable inductors) coupled between isolated node P4 and ground. If desired, isolated node termination 46 may include multiple chains of components that can be switched into use for covering different frequencies or channels. Capacitor(s) 56, resistor(s) 58, and inductor(s) 60 may be selected to configure isolated node termination 46 to exhibit an impedance as characterized by the reflection coefficient $\Gamma_{OPT,ISOL}$ of equation 1. The example of FIG. 4 is merely illustrative. In general, isolated node termination 46 may include any desired combination of non-switched components, switched components, switches, resistors, capacitors, inductors, etc., arranged in parallel, in series, or in any desired manner between isolated node P4 and ground that configure isolated node termination 46 to have an impedance as given by reflection coefficient $\Gamma_{OPT,ISOL}$ of equation 1.

Figure 5:
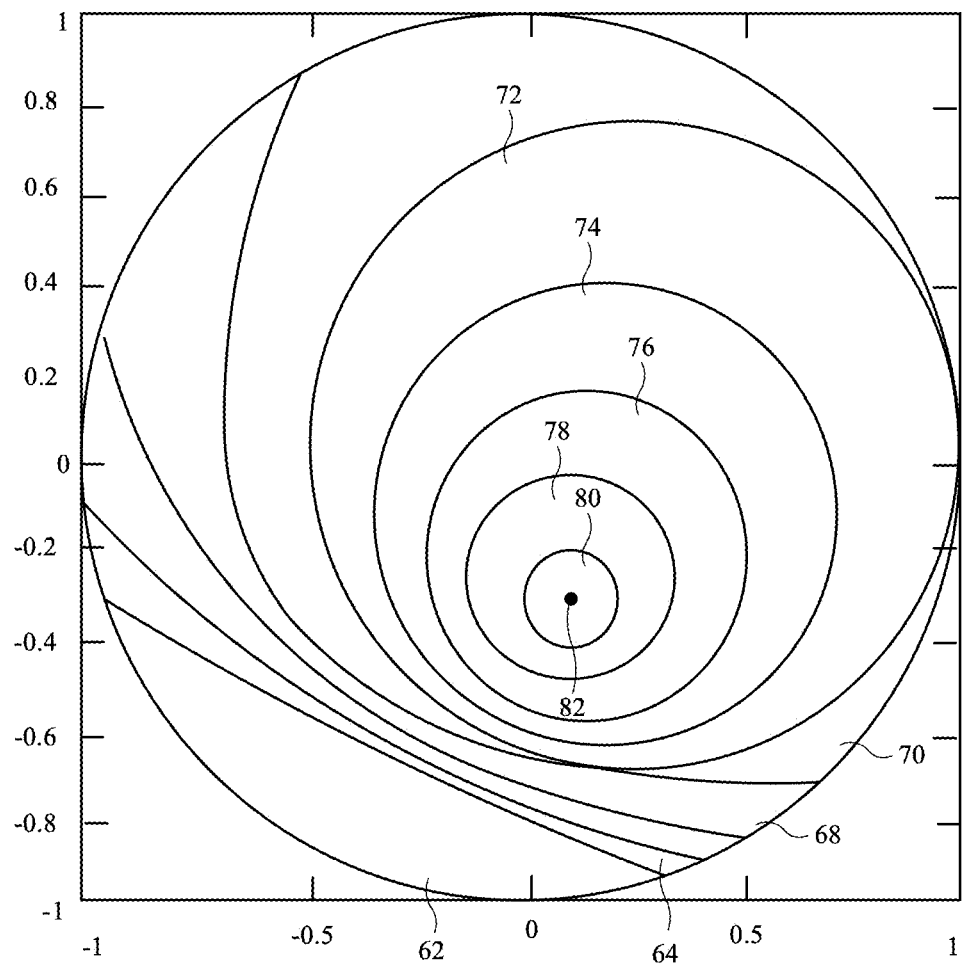
FIG. 5 is a plot of voltage standing wave ratio (VSWR) variation vs. reflection coefficient of an isolated node termination showing how the isolated node termination of FIGS. 2-5 may produce signal power level measurements that are invariant to VSWR variations in accordance with some embodiments.

FIG. 5 is a plot (Smith chart) of VSWR variation vs. different values of reflection coefficient $\Gamma_{T,ISOL}$ for isolated node termination 46. Regions 62-80 may be populated by points, where each point is a different value of reflection coefficient $\Gamma_{T,ISOL}$ for isolated node termination 46. As shown in FIG. 5, points within region 62 exhibit a large amount of VSWR variation and therefore correspond to reflection coefficients $\Gamma_{T,ISOL}$ for isolated node termination 46 that produce relatively inaccurate power level measurements as the impedance of output load 42 changes. Points within region 64 exhibit less VSWR variation than points within region 64, points within region 66 exhibit less VSWR variation than points within region 64, points within region 68 exhibit less VSWR variation than points within region 66, points within region 70 exhibit less VSWR variation than points within region 68, points within region 72 exhibit less VSWR variation than points within region 70, points within region 74 exhibit less VSWR variation than points within region 72, points within region 76 exhibit less VSWR variation than points within region 74, points within region 78 exhibit less VSWR variation than points within region 76, and points within region 80 exhibit less VSWR variation than points within region 78.

As shown by the relative size of regions 62-80, the amount of VSWR variation steadily decreases as the reflection coefficient $\Gamma_{T,ISOL}$ for isolated node termination 46 approaches (e.g., collapses onto) point 82. Point 82 corresponds to the reflection coefficient $\Gamma_{T,ISOL}=\Gamma_{OPT,ISOL}$, as given by equation 1. In other words, by configuring reflection coefficient $\Gamma_{T,ISOL}$ to equal $\Gamma_{OPT,ISOL}$, the power level measured by power detector 50 (FIGS. 2 and 3) becomes VSWR insensitive, as the power level perfectly tracks the power wave at the output load regardless of changes in the reflection coefficient $\Gamma_L$ of the output load.

Figure 6:
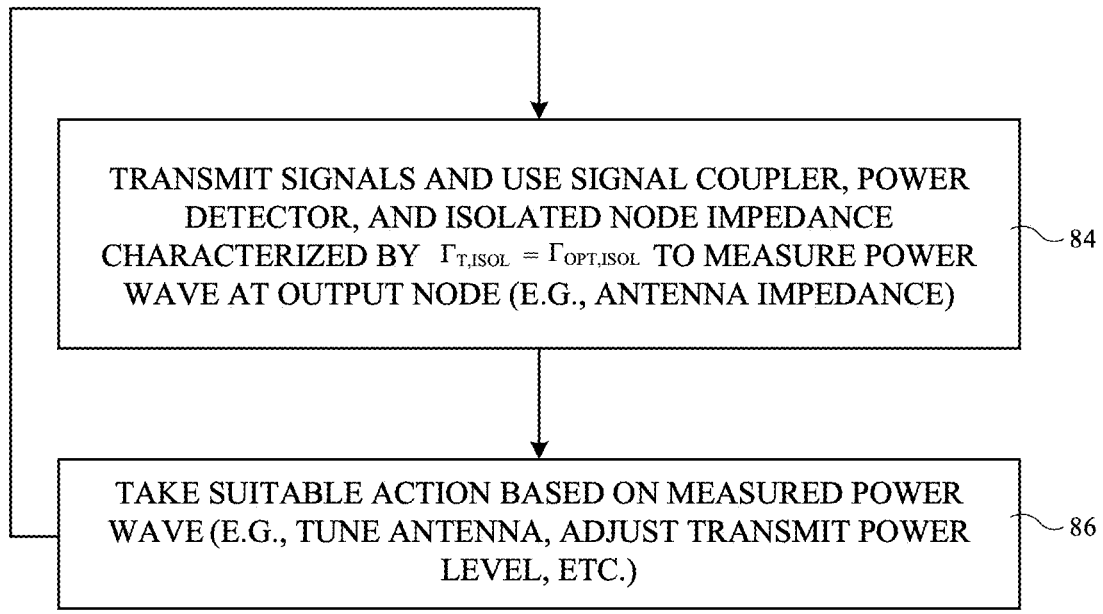
FIG. 6 is a flow chart of illustrative operations that may be performed by circuitry of the type shown in FIGS. 2-4 for measuring signal power levels at an output load that are invariant to impedance changes at the output load in accordance with some embodiments.

FIG. 6 is a flow chart of illustrative operations that may be performed by device 10 for gathering and processing measurements made by power detector 50 of FIGS. 2 and 3. At operation 84, power amplifier 36 may transmit radio-frequency signals on transmission line 34. Signal coupler 38 may couple some of the signals off of transmission line 34 and onto coupled node P3. Power detector 50 may measure the voltage $V_{PDET}$ and/or the corresponding power $P_{PDET}$ (FIG. 3) on coupled node P3. Configuring isolated node termination 46 to exhibit an impedance given by $\Gamma_{T,ISOL}=\Gamma_{OPT,ISOL}$ may configure voltage $V_{PDET}$, power $P_{PDET}$, and coefficient $b_3$ to perfectly track the power wave at output node N (e.g., characterizing output power Pout when the magnitude of $\Gamma_L$ is known) even as reflection coefficient $\Gamma_L$ of output load 42 changes. In general, $V_{PDET}$, $P_{PDET}$, and $b_3$ will track the power wave at output node N, which is characterized by coefficient $b_2$ and is sometimes referred to herein as power wave $b_2$, since $V_{PDET}$, $P_{PDET}$, and $b_3$ are all related to one another by a constant (whereas voltage/power at output node N is dependent on the output load itself). By measuring voltage $V_{PDET}$ and/or power $P_{PDET}$, power detector 50 may thereby accurately measure (e.g., generate, compute, gather, sense, detect, identify, etc.) power wave or signal wave at the output node, which is characteristic of output power level $P_{OUT}$, regardless of the current reflection coefficient $\Gamma_L$ of output load 42. Equivalently, $V_{PDET}$, $P_{PDET}$, and $b_3$ will perfectly track the output power $P_{OUT}$ at output node N for a fixed output load magnitude and thus may be used to measure output power level Pour for the fixed output load magnitude (e.g., independent of the load reflection coefficient phase).

At operation 86, control circuitry 14 may perform any desired operations based on the measured power or signal wave (e.g., output power level Pour) detected by power detector 50 via coupled node $P_3$. For example, control circuitry 14 may tune antenna 30 (e.g., to compensate for detuning due to loading by external object 54), may adjust impedance matching circuitry for antenna 30 (e.g., to allow transmission line 34 to match the impedance of antenna 30 to maximize energy transfer), may switch a different antenna into use or reduce the transmit power level of power amplifier 36 (e.g., to satisfy regulatory requirements on radio-frequency energy absorption and/or exposure given the presence of a body part adjacent antenna 30), may display or otherwise issue a notification, and/or may perform any other desired operations based on the detected power level. Processing may subsequently loop back to operation 84.

Figure 7:
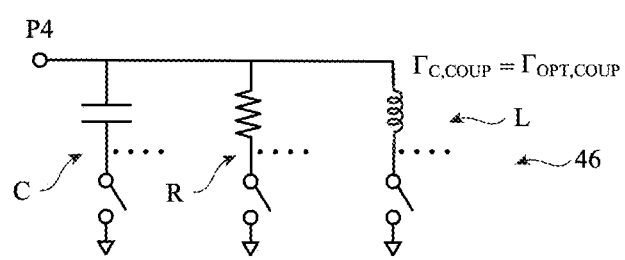
FIG. 7 is a diagram of an illustrative coupled node termination that may be coupled to a signal coupler for gathering forward and reverse wave measurements in accordance with some embodiments.

When signal coupler 38 is integrated into a reflectometer such as reflectometer 52 of FIG. 2, coupled node termination 44 may be coupled to coupled node P3 during RW signal measurements. FIG. 7 is a diagram of coupled node termination 44 in these implementations. As shown in FIG. 7, coupled node termination 44 may have circuit components such as one or more (switchable) capacitors C, one or more (switchable) resistors R, and/or one or more (switchable) inductors L that configure coupled node termination 44 to have an impedance characterized by an infinite reverse directivity, such that reflection coefficient $\Gamma_{T,COUP}=\Gamma_{OPT,COUP}$. The components of coupled node termination 44 may configure coupled node termination 44 to have a reflection coefficient $\Gamma_{T,COUP}=\Gamma_{OPT,COUP}=S_{41}/(S_{41}S_{33}-S_{43}S_{31})$, for example. In these arrangements, configuring isolated node termination 46 to have a reflection coefficient $\Gamma_{T,ISOL}=\Gamma_{OPT,ISOL}$ (e.g., as given by equation 1) may serve to minimize distortion in the measurements gathered using signal coupler 38.

Figure 8:
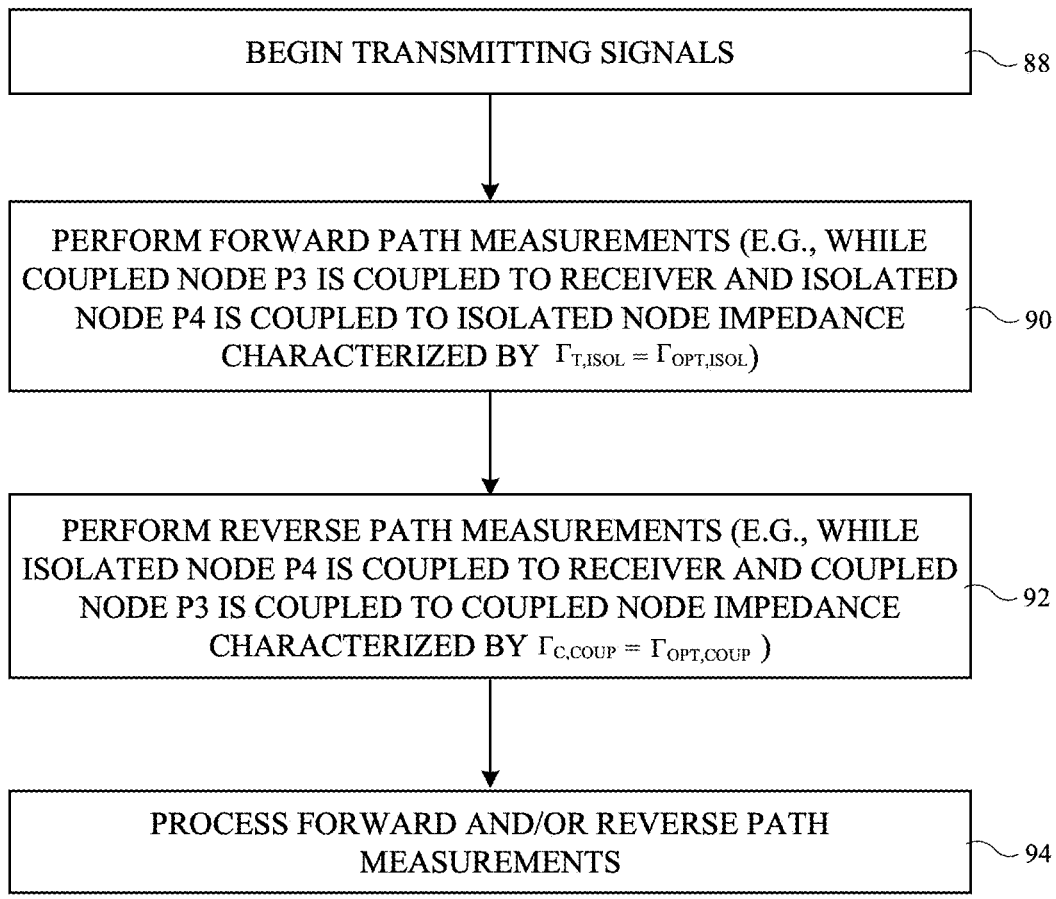
FIG. 8 is a flow chart of illustrative operations that may be performed by circuitry of the type shown in FIG. 2 to perform forward and reverse wave measurements with minimal distortion in accordance with some embodiments.

FIG. 8 is a flow chart of illustrative operations that may be performed by signal transmission circuitry 35 of FIG. 2 to perform forward and reverse wave measurements with minimal distortion. The operations of FIG. 8 may, for example, be performed while processing operation 84 of FIG. 6. At operation 88, power amplifier 36 may begin transmitting signals.

At operation 90, signal coupler 38 may perform forward path measurements (e.g., to measure the FW signal) while switch SW1 couples coupled node P3 to receiver 48 and switch SW2 couples isolated node P4 to isolated node termination 46 having reflection coefficient $\Gamma_{T,ISOL}=\Gamma_{OPT,ISOL}$ (e.g., as given by equation 1). Power detector 50 may measure the FW signal on coupled node P3 (as well as a portion of the RW signal bouncing off the isolated node termination).

At operation 92, signal coupler 38 may perform reverse path measurements (e.g., to measure the RW signal) while switch SW2 couples isolated node P4 to receiver 48 and switch SW1 couples coupled node P3 to coupled node termination 44 having reflection coefficient $\Gamma_{T,COUP}=\Gamma_{OPT,COUP}$. Power detector 50 may measure the RW signal on isolated node P4.

At operation 94, control circuitry 14 (FIG. 1) may process the forward and/or reverse path measurements (e.g., to characterize the impedance of output load 42). Configuring isolated node termination 46 to have reflection coefficient $\Gamma_{T,ISOL}=\Gamma_{OPT,ISOL}$ (e.g., as given by equation 1) may minimize distortion in the measurements. The example of FIG. 8 is merely illustrative. If desired, operation 90 or operation 92 may be omitted. Operation 92 may be performed prior to operation 90 if desired.

Configuring isolated node termination 46 to have reflection coefficient $\Gamma_{T,ISOL}=\Gamma_{OPT,ISOL}$ (e.g., as given by equation 1) may minimize distortion in the measurements made using signal coupler 38 of FIG. 2. When estimating reflection coefficient $\Gamma_L$ using signal coupler 38 while isolated node termination 46 is terminated with infinite forward directivity (e.g., where $\Gamma_{T,ISOL}=\Gamma_{\infty,F}$), the estimated reflection coefficient $\Gamma_L$ will exhibit substantial distortion, producing errors in the estimated reflection coefficient. However, when isolated node termination 46 is terminated with reflection coefficient $\Gamma_{T,ISOL}=\Gamma_{OPT,ISOL}$ (e.g., as given by equation 1), there may be almost no distortion in the estimated reflection coefficient $\Gamma_L$ (e.g., producing just a constant multiplier on the value of $\Gamma_L$), thereby producing an accurate estimated reflection coefficient. This may, for example, configure signal coupler 38 to form an accurate VNA for measuring the impedance of a particular point (e.g., output node N).

The examples of FIGS. 2-8 are merely illustrative. While described in connection with radio-frequency signal transmission as an example, signal coupler 38 may be used to gather measurements at any desired frequencies for characterizing the impedance, phase, magnitude, power wave level, and/or VSWR of any desired output load 42 and output node N accurately, even as reflection coefficient $\Gamma_L$ of the output load changes over time.

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The methods and operations described above in connection with FIGS. 1-9 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. An electronic device comprising:
    a signal source;
    an output load coupled to the signal source over a signal path, the signal source being configured to transmit a signal to the output load over the signal path and the output load having a first reflection coefficient;
    a signal coupler disposed on the signal path, the signal coupler having a first node communicably coupled to the signal source, a second node communicably coupled to the output load, a third node, and a fourth node, and the signal coupler being characterized by scattering parameters $S_{21}$, $S_{32}$, $S_{22}$, and $S_{31}$;
    a power detector communicably coupled to the third node and configured to measure a voltage at the third node; and
    a termination communicably coupled to the fourth node, the termination having circuit components that configure the termination to exhibit a second reflection coefficient that is directly proportional to $S_{21}*S_{32}-S_{22}*S_{31}$.

2. The electronic device of claim 1, wherein the second reflection coefficient is a function of an $S_{44}$ scattering parameter value of the signal coupler, an $S_{34}$ scattering parameter value of the signal coupler, and an $S_{42}$ scattering parameter value of the signal coupler.

3. The electronic device of claim 2, wherein the second reflection coefficient is a function of an $S_{41}$ scattering parameter value of the signal coupler and an $S_{24}$ scattering parameter value of the signal coupler.

4. The electronic device of claim 3, wherein the second reflection coefficient has a denominator that is a function of the $S_{44}$ scattering parameter value, the $S_{34}$ scattering parameter value, the $S_{42}$ scattering parameter value, the $S_{41}$ scattering parameter value, and the $S_{24}$ scattering parameter value.

5. The electronic device of claim 1, wherein the signal coupler is further characterized by scattering parameters $S_{44}$, $S_{34}$, $S_{42}$, $S_{41}$, and $S_{24}$ scattering parameter, the second reflection coefficient being inversely proportional to $S_{21}*(S_{32}*S_{44}-S_{34}*S_{42})+S_{22}*(S_{34}*S_{41}-S_{31}*S_{44})+S_{24}*(S_{31}*S_{42}-S_{32}*S_{41})-$.

6. The electronic device of claim 1, wherein the signal source comprises a power amplifier, the signal path comprises a radio-frequency transmission line, the output load comprises an antenna, and the signal comprises a radio-frequency signal.

7. The electronic device of claim 6, further comprising:
    one or more processors configured to adjust the antenna based at least in part on the voltage at the third node measured by the power detector.

8. The electronic device of claim 6, further comprising:
    one or more processors configured to reduce a transmit power level of the power amplifier based at least in part on the voltage at the third node measured by the power detector.

9. A method of operating an electronic device, the method comprising:
    transmitting, using a power amplifier, a radio-frequency signal to an output node over a transmission line, the output node being coupled to an antenna;
    coupling, using a signal coupler disposed on the transmission line, at least some of the radio-frequency signal onto a coupled node of the signal coupler while an isolated node of the signal coupler is coupled to a termination, the signal coupler being characterized by scattering parameters $S_{21}$, $S_{32}$, $S_{22}$, and $S_{31}$, and the termination having circuit components that configure the termination to exhibit a reflection coefficient that is directly proportional to $S_{21}*S_{32}-S_{22}*S_{31}$; and
    detecting, using a power detector, a voltage of the radio-frequency signal coupled onto the coupled node.

10. The method of claim 9, the method further comprising:
    adjusting the antenna based at least in part on the voltage detected by the power detector.

11. The method of claim 9, the method further comprising:
    reducing a transmit power level of the power amplifier based at least in part on the voltage detected by the power detector.

12. The method of claim 9, further comprising:
    coupling, using the signal coupler, at least some of a reverse wave (RW) signal onto the isolated node while the coupled node is coupled to an additional termination causing an infinite reverse wave directivity; and
    detecting, using the power detector, a voltage of the RW signal coupled onto the isolated node.

13. The method of claim 9, wherein the signal coupler is further characterized by scattering parameters $S_{44}$, $S_{34}$, $S_{42}$, $S_{41}$, and $S_{24}$, the reflection coefficient being inversely proportional to $S_{21}*(S_{32}*S_{44}-S_{34}*S_{42})+S_{22}*(S_{34}*S_{41}-S_{31}*S_{44})+S_{24}*(S_{31}*S_{42}-S_{32}*S_{41})$.

14. An electronic device comprising:
    a power amplifier;
    an output node coupled to an antenna;
    a transmission line that couples the power amplifier to the output node;
    a signal coupler disposed on the transmission line and having a coupled node and an isolated node, the signal coupler being configured to transmit a first portion of a signal wave to the output node while coupling a second portion of the signal wave onto the coupled node, and the signal coupler being characterized by scattering parameters $S_{21}$, $S_{32}$, $S_{44}$, $S_{34}$, $S_{42}$, $S_{22}$, $S_{41}$, $S_{31}$, and $S_{24}$;
    a power detector communicably coupled to the coupled node; and
    a termination communicably coupled to the isolated node, wherein the termination has circuit components that configure the termination to exhibit a reflection coefficient that is inversely proportional to $S_{21}*(S_{32}*S_{44}-S_{34}*S_{42})+S_{22}*(S_{34}*S_{41}-S_{31}*S_{44})+S_{24}*(S_{31}*S_{42}-S_{32}*S_{41})$.

15. The electronic device of claim 14, further comprising:
    a first switch that couples the coupled node to an additional termination and to the power detector; and
    a second switch that couples the isolated node to the termination and to the power detector.

16. The electronic device of claim 14, the reflection coefficient being directly proportional to $S_{22}*S_{32}-S_{22}*S_{31}$.

* * * * *

UNITED STATES PATENT AND TRADEMARK OFFICE
CERTIFICATE OF CORRECTION

| | | |
|---|---|---|
| PATENT NO. | : 11,888,504 B2 | Page 1 of 1 |
| APPLICATION NO. | : 17/675983 | |
| DATED | : January 30, 2024 | |
| INVENTOR(S) | : Lucas Calderin and Mehmet T Ozgun | |

It is certified that error appears in the above-identified patent and that said Letters Patent is hereby corrected as shown below:

In the Claims

Column 15, Lines 38-39, Claim 5, "scattering parameter, the second reflection coefficient" should read -- the second reflection coefficient --

Signed and Sealed this
Third Day of December, 2024

Katherine Kelly Vidal
*Director of the United States Patent and Trademark Office*